United States Patent [19]

Tregilgas et al.

[11] Patent Number: 4,675,087
[45] Date of Patent: Jun. 23, 1987

[54] SEMICONDUCTOR PURIFICATION BY SOLID STATE ELECTROMIGRATION

[75] Inventors: John H. Tregilgas, Richardson; Bruce E. Gnade, Dallas, both of Tex.

[73] Assignee: Texas Instruments Incorporated, Dallas, Tex.

[21] Appl. No.: 636,060

[22] Filed: Jul. 31, 1984

[51] Int. Cl.[4] .............................................. C25F 1/00
[52] U.S. Cl. ................................. 204/141.5; 204/130; 204/180.1; 134/1
[58] Field of Search ................... 204/180 R, 250, 219, 204/141.5, 180.1, 130; 29/584; 148/DIG. 60; 134/1

[56] References Cited

U.S. PATENT DOCUMENTS

| | | | |
|---|---|---|---|
| 2,983,655 | 5/1961 | Sullivan | 204/141.5 X |
| 3,042,593 | 7/1962 | Michlin | 204/141.5 |
| 3,088,888 | 5/1963 | Leff | 204/141.5 X |
| 3,890,215 | 6/1975 | DiLorenzo et al. | 29/584 |
| 3,896,016 | 7/1975 | Goodman et al. | 204/180 R |
| 4,197,141 | 4/1980 | Bozler et al. | 204/130 X |
| 4,381,598 | 5/1983 | Anthony | 29/584 |
| 4,392,928 | 7/1983 | Yang et al. | 204/130 |
| 4,549,912 | 10/1985 | Anthony | 29/584 X |

FOREIGN PATENT DOCUMENTS 2147971 3/1973 Fed. Rep. of Germany.

Primary Examiner—R. L. Andrews
Attorney, Agent, or Firm—Carlton H. Hoel; Leo N. Heiting; Melvin Sharp

[57] ABSTRACT

The removal of residual impurities from semiconductor material is accomplished by solid state electromigration of the impurities from the semiconductor slice into a surrounding conductive liquid (e.g. Hg) which is maintained at a negative potential.

20 Claims, 1 Drawing Figure

SEMICONDUCTOR PURIFICATION BY SOLID STATE ELECTROMIGRATION

BACKGROUND AND SUMMARY OF THE INVENTION

The present invention relates to preparation of extremely pure semiconductors.

The semiconductor HgCdTe has been a subject of development interest in the semiconductor art. The primary use of this material is for infrared imaging devices. In such applications, photosensing is accomplished by detecting carrier pairs generated in this very narrow bandgap material by direct absorption of infrared photons. For example, this may be done by sensing the amount of charge collected in a depletion well. However, the background carrier concentration is also available to fill these wells, so it is desirable to reduce this background carrier concentration as low as possible, to minimize dark current and improve the signal-to-noise ratio. This in turn requires keeping the residual dopant concentration as low as possible, preferably low enough to achieve a net carrier concentration below $1 \times 10^{15}$ ions per cubic centimeter. This is not easy.

It is desirable to remove unwanted impurities, particularly group IB impurities, namely Cu, Ag, Au, which can diffuse into HgCdTe active device layers during conventional processing techniques. The terms HgCdTe herein represents $Hg_{1-x}Cd_xTe$ where x ranges between 0 and 1. In the present invention, removal of these impurities is accomplished by solid state electromigration, whereby p-type (or rapidly diffusing n-type) impurities move as positively charged interstitials through the HgCdTe crystal lattice in the presence of an electric current passing through the crystal lattice. The presence of an electric current (not merely the overall field, but also the local perturbations due to an electron passing within a few lattice spacings of a mobile impurity) increases the probability of impurities to diffuse as positively charged interstitials toward a negative electrode maintained at the slice surface, thereby speeding the removal of the impurities from all port ions of the HdCdTe slice. (The transport mechanism is generally analog to ionic conduction in a solid electrolyte.) Diffusion of the impurities in the absence of an electric field would be random, and the probability of the impurities diffusing out of the HgCdTe slice would be low. It is desirable to lower the residual carrier concentration to less than $1 \times 10^{15}/cm^{-3}$ in order to maximize the efficiency of HgCdTe infrared imaging devices, and removal of mobile positively charged impurities assists in this.

Existing techniques for reducing the residual acceptor concentration are undesirable since they cause decomposition of the HgCdTe material or longitudinal composition gradients within the HdCdTe ingots. There are no previously demonstrated non-destructive techniques other than the one described herein for reducing the residual acceptor concentration in HgCdTe material.

It is an object of this invention to provide a non-destructive method for purifying HgCdTe semiconductor slices in order to achieve residual acceptor concentrations less than $1 \times 10^{15}/cm^{-3}$.

It is a further object of this invention to provide a method for the removal of Group IB impurities from HgCdTe semiconductor material without etching.

According to the present invention there is provided:

A method for purifying semiconductors, comprising the steps of:

making contact to a portion of a semiconductor to be purified;

immersing said semiconductor portion in a conductive liquid; and passing current between said semiconductor portion and said conductive liquid;

whereby impurities electromigrate from said semiconductor into said liquid.

BRIEF DESCRIPTION OF THE DRAWING

The present invention will be described with reference to the accompanying drawing, wherein:

The FIGURE shows an apparatus for practicing the method of the present invention.

DESCRIPTION OF THE PREFERRED EMBODIMENTS

Figure 1:
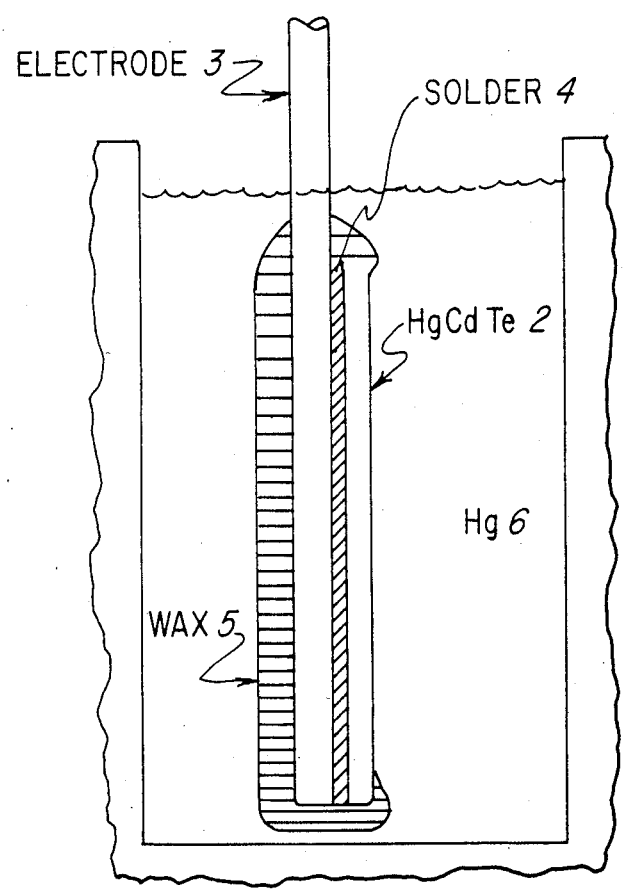

The present invention provides a non destructive method for achieving acceptor concentrations less than $1 \times 10^{15}/cm^{-3}$ in HgCdTe semiconductor material.

This is achieved by solid state electromigration of Group IB impurities from the HgCdTe slice into a surrounding liquid Hg reservoir which is maintained at a negative potential. It is advantageous to use a liquid electrode, since the diffusion of unwanted impurities is very rapid in any liquid. This prevents an undesirable pileup of impurities at the slice/Hg electrode interface which inhibits the removal of said impurities from the HgCdTe slice. The liquid Hg electrode also permits slight Hg diffusion to annihilate unwanted Hg vacancies which were formed during the solid state recrystallization of HgCdTe. It is further advantageous to use a liquid Hg electrode since its use eliminates the need for a post diffusion etch to remove the unwanted impurities from the HgCdTe slice surface as would be the case if a solid electrode were used.

The FIGURE illustrates the process. In the presently preferred embodiment, a HgCdTe slice 2 is affixed to an electrode 3 in such a fashion so as to provide reliable electrical contact between the slice 2 and the electrode 3. Soldering the slice to the electrode is one such method for achieving this contact. The electrode and the side of the slice to which it is attached is then masked with an electrically insulating material such as wax 5. The slice is then inserted into a reservoir of Hg 6. The electrode which is affixed to the slice is maintained at a positive potential, while the Hg is maintained at a negative potential. A current density between $1 \times 10^{-5} A/cm^2$ and $1 \times 10^{-5} A/cm^2$ must be established across the slice. This current density is maintained for at least 1 minute but not longer than 1 month. The impurities diffuse from the slice into the Hg via solid state electromigration. The use of pure Hg is non-destructive and non-contaminating to the HgCdTe material. This process can be performed at temperatures as low as $-1000°$ C. but not higher than 500° C.

The present invention could be applied to HgCdTe slices before or after post annealing in Hg, and could be applied to polished or unpolished slices. The present invention could also be applied to HgCdTe slices with or without an epitaxial layer, such as HgCdTe epitaxy on CdTe, although higher current densities must be maintained across slices which possess an epitaxial layer.

The present invention could also be applied to Si slices by using a Hg or Ga or In reservoir as the negative electrode. The present invention could also be applied to GaAs slices by using liquid Ga as the negative electrode. In general, the present invention is applicable to purification of any semiconductor system where a low level of residual impurities is desired. The present invention is most preferably applied to those semiconductor systems where a conductive liquid exists which is compatible with the semiconductor. For example, Hg is already present in HgCdTe, and a slight in diffusion of Hg may actually be beneficial. Thus the present invention is readily applicable to semiconductors where one component is liquid at low temperature, such as all pseudo-binary alloys of HgTe and CdTe; all pseudo-binary alloys of HgSe and CdSe; InP, GaAs, and other III-V compound semiconductors; and also to many others.

However, even where the liquid electrode is not compatible with the semiconductor (e.g. Hg with silicon), the present invention may still be applied to remove impurities which are faster diffusing in the liquid electrode material. For example, an Hg electrode could be used to remove Li from Si, followed by an etch-back to remove the silicon surface layer which had been contaminated by in-diffusion.

Alternative embodiments can be performed at rather high temperatures. For example, CdTe can be purified, using a liquid cadmium electrode, at temperatures well above 300° C. In such high-temperature embodiments, the melt composition is preferably chosen (according to phase diagram methods well known in the LPE art) so that neither deposition nor meltback occurs. Such high-temperature embodiments are particularly advantageous for semiconductors having a relatively wide band-gap, such as CdTe, to lower the bulk resistivity and permit a reasonable current density.

In addition, higher temperature means that impurities are more likely to be displaced into highly mobile interstitial locations. The present invention will not remove impurities bound on lattice sites, since the electric field perturbation caused by a passing electron will not normally provide enough activation energy to displace a substitutional impurity.

Transport of impurities in the present invention is both voltage-dependent and current-dependent. It would be possible to use voltage-dependent transport only at low current density, but this is much less desirable since it is slow unless excessive voltage is used.

As will be obvious to those skilled in the art, the present invention can be widely varied and is not limited except as set forth in the accompanying claims.

In a sample embodiment, in order to demonstrate an optimum method for reducing group Ib impurities in HgCdTe, a slice uniformly doped with radioactive Ag was soldered to an electrode, masked with wax, and inserted into a reservoir of Hg which was held at a negative potential. Use of pure Hg contacts should be non-destructive, non-contaminating, and will lower the concentration of the group Ib impurity at the surface of the slice if transport occurs into the Hg. After a week using a current density of about 10 amps/cm² the sample was measured and found to retain only 15% of the initial radioactive Ag. Physical transport of the Ag into the Hg reservoir was found to occur, thereby demonstrating a viable methodology for application to HgCdTe slices.

What is claimed is:

1. A method for purifying semiconductor material, comprising the steps of:
   (a) providing a body of semiconductor material;
   (b) providing a reservoir of liquid metal composed of non-doping elemental species;
   (c) immersing at least a portion of said semiconductor material into said reservoir of liquid metal; and
   (d) passing electric current through said semiconductor material and into said reservoir of liquid metal to cause impurities to migrate from said semiconductor material into said liquid metal.

2. The method of claim 1, wherein said reservoir of liquid metal consists essentially of mercury.

3. The method of claim 1, wherein said reservoir of liquid metal is selected from the group consisting of gallium, indium and antimony, and said semiconductor is a group III–IV compound semiconductor.

4. The method of claim 1, wherein said semiconductor material consists essentially of $Hg_{1-x}Cd_xTe$ and x ranges between 0 and 1 inclusive.

5. The method of claim 1, wherein current is passed through said semiconductor material at a current density between $10^{-5}$ Ampere/cm² and $10^5$ Ampere/cm².

6. The method of claim 1,
   wherein said liquid is connected to a negative potential,
   whereby positively charged ionized interstitial impurities are removed from said semiconductor material.

7. The method of claim 1, wherein said liquid is a liquid metal.

8. The method of claim 1, wherein said semiconductor material is heated during application of said current, to lower its resistivity.

9. The method of claim 1, wherein said semiconductor material comprises an epitaxial layer of HgCdTe, containing between 7 and 25 atomic % mercury, on a CdTe substrate.

10. The method of claim 4, further comprising the additional step, prior to application of said current, of: at least partially completing fabrication of a plurality of infrared-detecting device structures on said $Hg_{1-x}Cd_xTe$.

11. A method for purifying semiconductor material, comprising the steps of:
   (a) providing a body of semiconductor material to be purified;
   (b) providing a reservoir of liquid metal composed of non-doping elemental species;
   (c) providing a pair of contacts to said semiconductor material to be purified at two spaced locations on said semiconductor material to be purified, one of said contacts being said reservoir of liquid metal;
   (d) passing current between said contacts to provide a current density in said semiconductor material between $10^{-5}$ ampere/cm² and $10^5$ ampere/cm², to cause impurities to electromigrate from said semiconductor material into said reservoir of liquid metal; and
   (e) removing said contacts from said semiconductor material.

12. A method for purifying semiconductor material, comprising the steps of:
   (a) providing a body of semiconductor material to be purified;
   (b) providing a reservoir of liquid metal composed of non-doping elemental species;

(c) providing a pair of contacts to said semiconductor material to be purified at two spaced locations on said semiconductor material to be purified, one of said contacts being said reservoir;

(d) causing impurities in said semiconductor material to electromigrate into said reservoir; and (e) removing said contacts from said semiconductor material.

13. The method of claim 2, wherein said semiconductor material consists essentially of $Hg_{1-x}Cd_xTe$ and x ranges between 0 and 1 inclusive.

14. The method of claim 6, wherein said semiconductor material consists essentially of $Hg_{1-x}Cd_xTe$ and x ranges between 0 and 1 inclusive.

15. The method of claim 2, wherein current is passed through said semiconductor material at a current density between $10^{-5}$ Ampere/cm$^2$ and $10^5$ Ampere/cm$^2$.

16. The method of claim 4, wherein current is passed through said semiconductor material at a current density between $10^{-5}$ Ampere/cm$^2$ and $10^5$ Ampere/cm$^2$.

17. The method of claim 13, wherein current is passed through said semiconductor material at a current density between $10^{-5}$ Ampere/cm$^2$ and $10^5$ Ampere/cm$^2$.

18. The method of claim 14, wherein current is passed through said semiconductor material at a current density between $10^{-5}$ Ampere/cm$^2$ and $10^5$ Ampere/cm$^2$.

19. The method of claim 6, wherein said reservoir of liquid metal consists essentially of mercury.

20. The method of claim 9, wherein said reservoir of liquid metal consists essentially of mercury.

* * * * *